(12) United States Patent
Pickett et al.

(10) Patent No.: US 8,729,518 B2
(45) Date of Patent: May 20, 2014

(54) MULTILAYER STRUCTURE BASED ON A NEGATIVE DIFFERENTIAL RESISTANCE MATERIAL

(75) Inventors: Matthew D. Pickett, San Francisco, CA (US); R. Stanley Williams, Portola Valley, CA (US); Gilberto M. Ribeiro, Palo Alto, CA (US); Warren Jackson, San Fracisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 63 days.

(21) Appl. No.: 13/281,186

(22) Filed: Oct. 25, 2011

(65) Prior Publication Data

US 2013/0099187 A1    Apr. 25, 2013

(51) Int. Cl.
*H01L 47/00*    (2006.01)

(52) U.S. Cl.
USPC .............................................. 257/2; 428/432

(58) Field of Classification Search
USPC ............................................. 257/2; 365/159
See application file for complete search history.

(56) References Cited

U.S. PATENT DOCUMENTS

| 6,570,224 B1 | 5/2003 | Ilyanok | |
| 2012/0104346 A1* | 5/2012 | Yi et al. | 257/4 |
| 2012/0138885 A1* | 6/2012 | Wu et al. | 257/5 |
| 2012/0195099 A1* | 8/2012 | Miao et al. | 365/148 |

FOREIGN PATENT DOCUMENTS

CN    101004927    7/2007

OTHER PUBLICATIONS

Merrikh-Bayat, F. et al., Bottleneck of Using Single Memristor as a Synapse and Its Solution, (Research Paper), IEEE Transactions on Neural Networks, Sep. 5, 2010.
Viswanath, B. at al., Geometric Confinement Effects on the Metal-insulator Transition Temperature and Stress Relaxation in Vo2 Thin Films Grown on Silicon, (Research Paper).

\* cited by examiner

*Primary Examiner* — Asok K Sarkar
*Assistant Examiner* — Dmitriy Yemelyanov

(57) ABSTRACT

A multilayer structure is disclosed that includes a conductive layer, a layer of a negative differential resistance (NDR) material disposed above the conductive layer, a layer M2 disposed above the NDR material, a second layer of NDR material disposed above layer M2, and a conductive layer disposed above the second NDR layer. Layer M2 can include a conductive material interspersed with regions of a dielectric material or a layer of the dielectric material and regions of the conductive material disposed above and below the dielectric material.

24 Claims, 10 Drawing Sheets

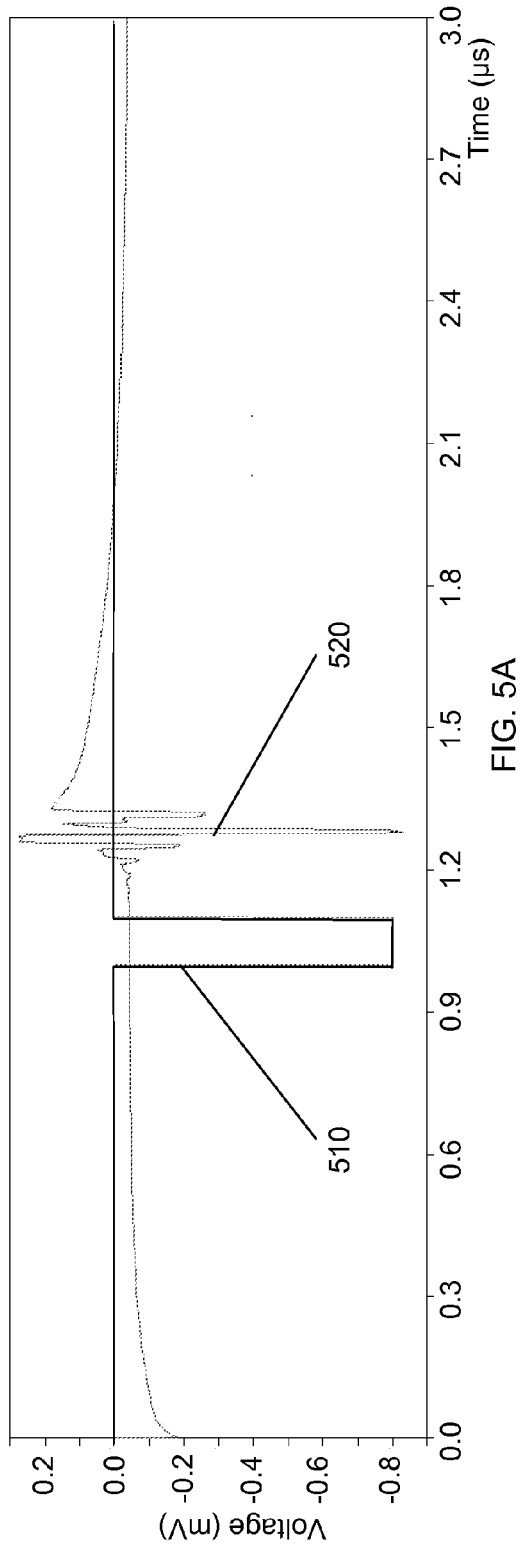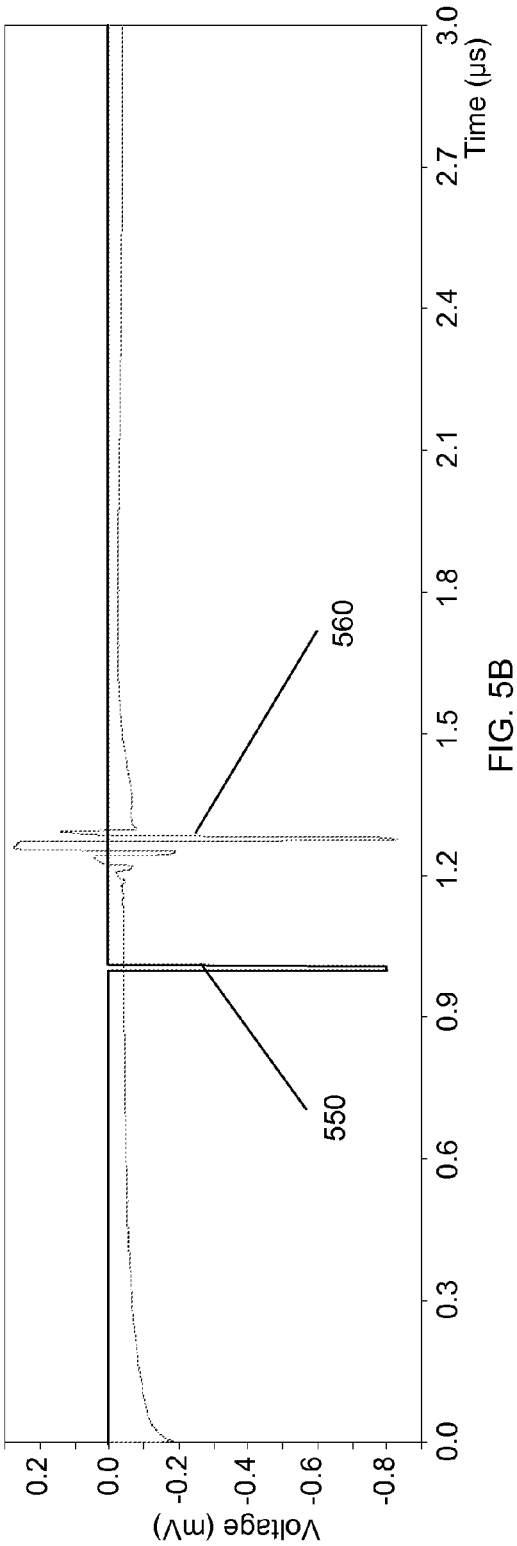

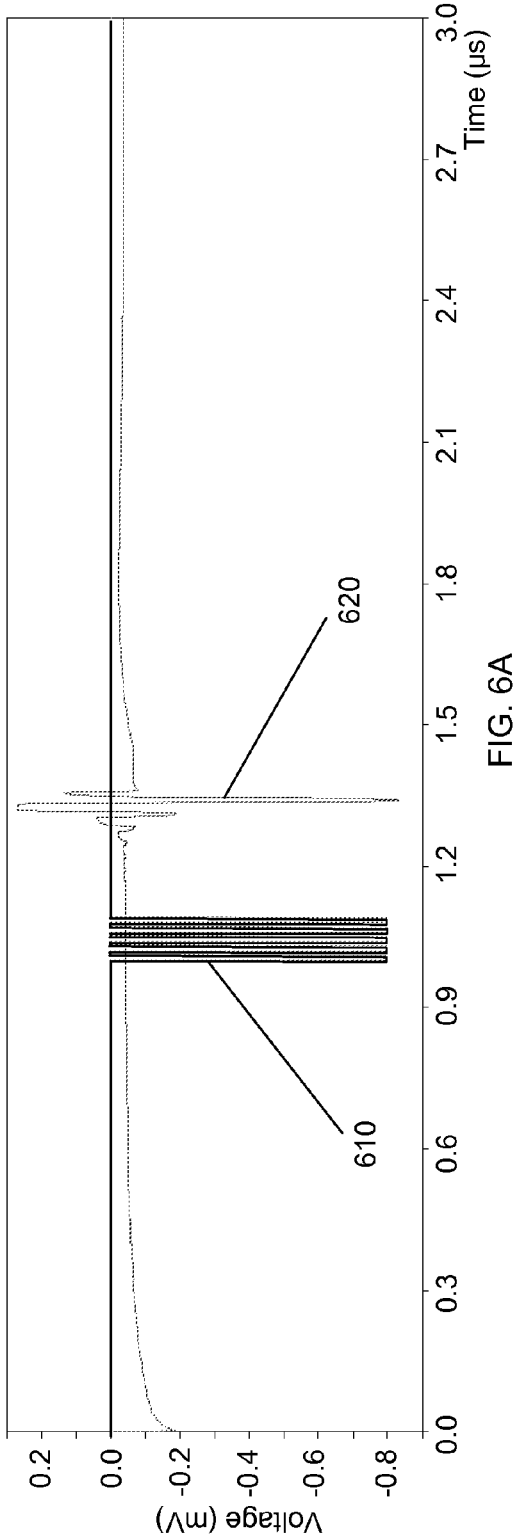
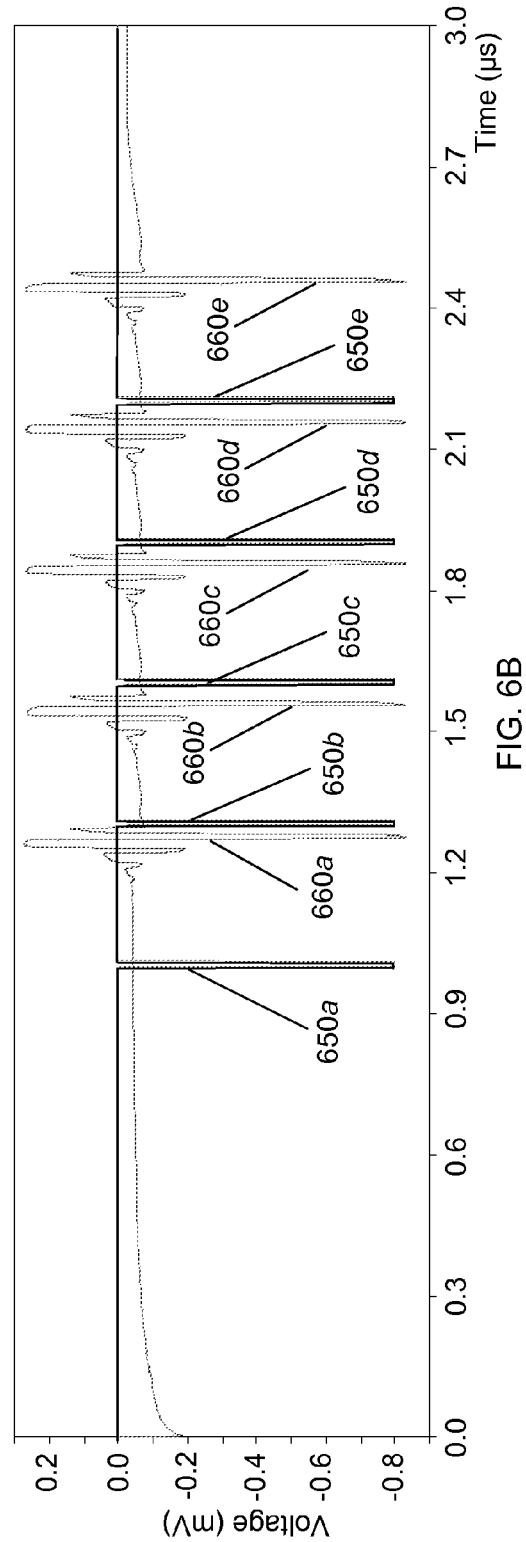
FIG. 6A
FIG. 6B

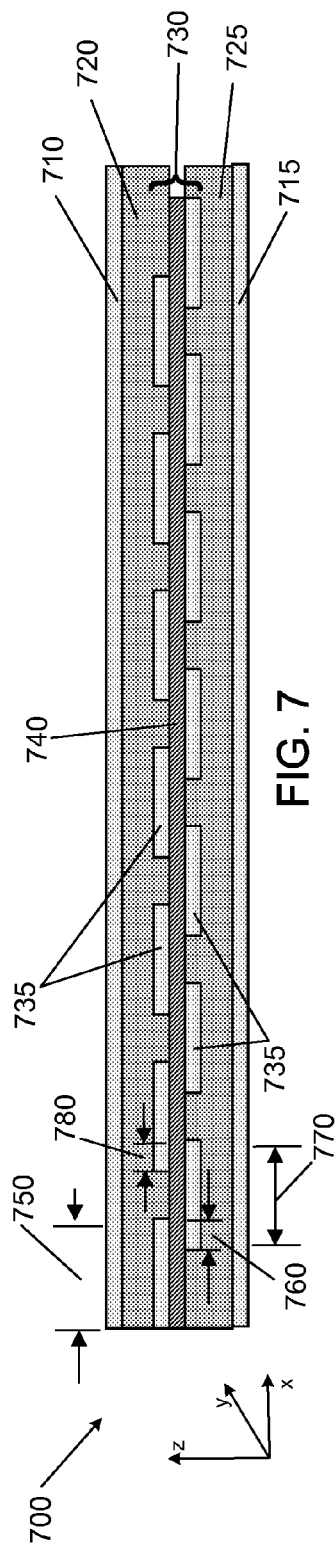
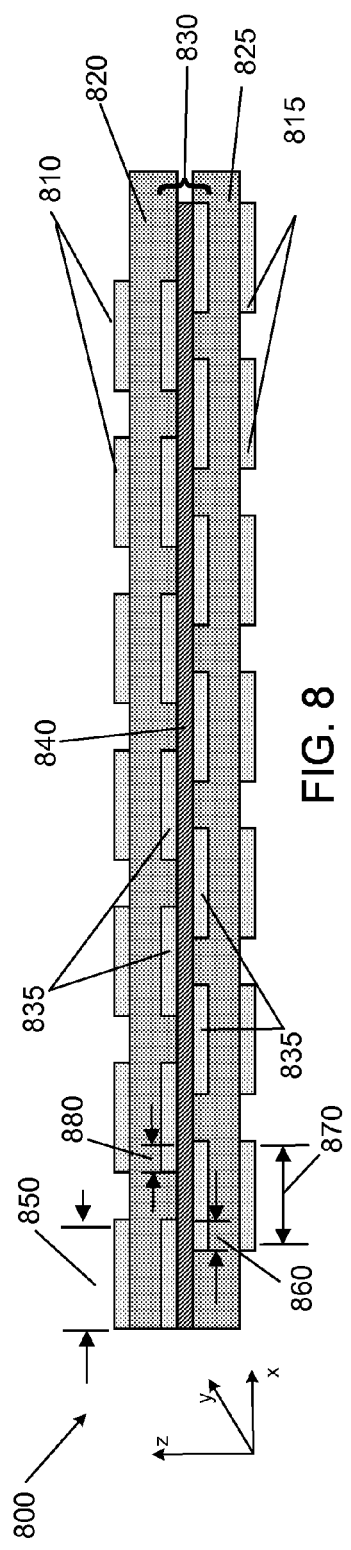
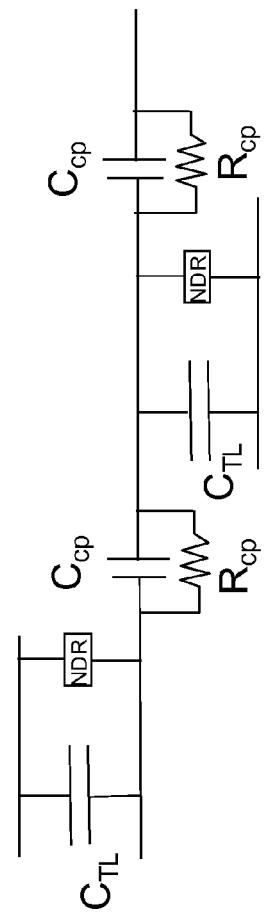
FIG. 7
FIG. 8
FIG. 9 ately in the transmission. The refractory period
MULTILAYER STRUCTURE BASED ON A NEGATIVE DIFFERENTIAL RESISTANCE MATERIAL

BACKGROUND

Considerable research effort is being expended to develop electronic logic networks that mimic the human brain. The ideal building blocks of an electronic logic networks are components that can emulate the properties of neurons. Research is focused on developing a neuristor, an electronic component that processes signals in a manner that models the behavior of neurons. Desirable properties of neurons include thresholding, pulse shaping, and a refractory period. Thresholding refers to an activation threshold for a neuron before it fires a pulse to transmit a signal. Pulse-shaping refers to the ability of a neuron to regenerate the shape of the transmitting pulses, and thus prevent attenuation and dispersal of pulses traveling throughout the transmission. The refractory period is the time during which it is difficult or impossible to initiate a subsequent action potential on a neuron after it has been fired. Thus, pulses can be transmitted through the neuron if the incoming pulses are widely separated. Some incoming pulses are skipped and not transmitted if the time interval between them is shorter than the refractory period. An ideal neuristor should be able to exhibit these desirable properties.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIGS. 5A and 5B show example computation results of the response of a multilayer structure to −0.8V signal pulses applied for 100 ns (FIG. 5A) and 10 ns (FIG. 5B).

FIGS. 6A and 6B show example computation results of the response of a multilayer structure to −0.8V signal pulses applied in quick succession (FIG. 6A) and with a longer delay between pulses (FIG. 6B).

FIG. 7 illustrates a cross-section view of another example multilayer structure.

FIG. 8 illustrates a cross-section view of another example multilayer structure.

FIG. 9 illustrates a lumped circuit diagram of the example multilayer structures of FIGS. 7 and 8.

Throughout the drawings, identical reference numbers designate similar, but not necessarily identical, elements.

DETAILED DESCRIPTION

Figure 1A:
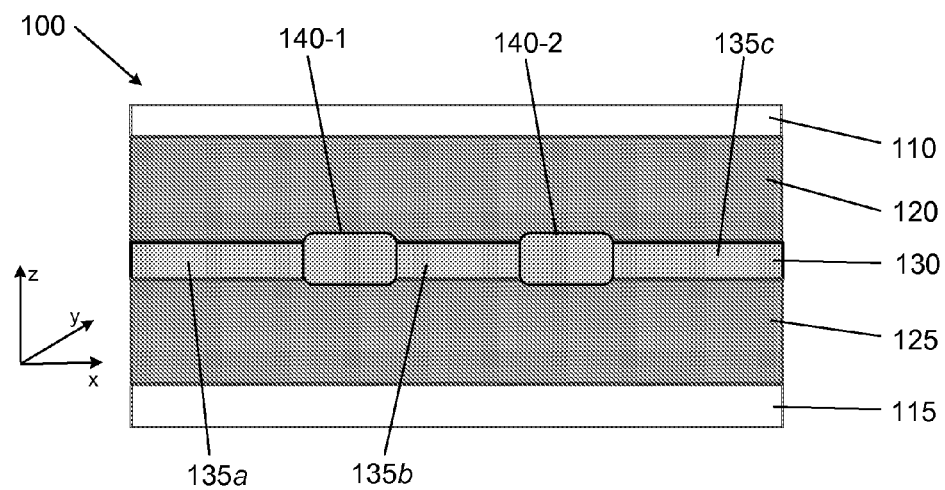
FIG. 1A illustrates a cross-section view of an example multilayer structure.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment or example, but not necessarily in other embodiments or examples. The various instances of the phrases "in one embodiment," "in one example," or similar phrases in various places in the specification are not necessarily all referring to the same embodiment or example.

As used herein, the term "includes" means includes but not limited to, the term "including" means including but not limited to. The term "based on" means based at least in part on.

Described herein are electronic devices that are configured to behave as an active nonlinear transmission line. The electronic devices are formed as multilayer structures that include a material that exhibits negative differential resistance. For example, the material can be a current driven insulator-metal phase transition material. The material can be a current-controlled negative differential resistance material. The current-controlled negative differential resistance material can act as a nonlinear active medium that injects energy along the length of the multilayer structure acting as a transmission line. The multilayer structure acts as a type of neuristor. The behavior of the multilayer structures described herein can be exploited to create circuits that perform logic operations and memory operations. The multilayer structures described herein can be used to simulate the behavior of biological axons (the portion of neurons that transmit signals).

The multilayer structures described herein are active transmission lines that have neuristor characteristics, operated as a switching signal transmission line.

Neuristors based on bipolar junction transistors and resonant tunneling diodes have been proposed. Bipolar junction transistors can be costly. Their manufacture generally requires full semiconductor processing. Additionally, since bipolar junction transistor manufacture is based on a silicon process, it is generally limited to two dimensions. Resonant tunneling diodes can be impractical. They require discrete inductors and thus cannot be integrated. Both of these technologies are hard-wired and do not provide a mechanism for dynamically alterable connections, a fact which limits their functionality.

The multilayer structures described herein are practical implementations of theoretical neuristors, since they can be produced by a thin-film back end process. This enables multiple stacks of the multilayer structures herein to be fabricated in an integrated circuit. Additionally, the thin-film nature of the multilayer structures described herein allow for roll-to-roll type processing on flexible substrates. That is, multilayer structures described herein do not require a semiconductor substrate. A thin-film process also allows for memristive devices to be fabricated as weighted connections between neuristors to provide new functionalities.

Also described herein are composite devices that are comprised of the multilayer structures (acting as transmission lines) bridged by bridging components. The bridging components include memristive devices. The memristive device between multilayer structures facilitates additional functionality by allowing for dynamically changing connections between the multilayer structures. This dynamical behavior would be comparable to a synaptic connection between axons in a biological simulation circuit. That is, the composite device of the bridged transmission lines exhibits the electronic characteristics of neurons linked by a synapse.

A thin-film process can be used to manufacture the composite devices that are comprised of the multilayer structures bridged by the memristive devices. The thin-film process enables three dimensional connections as well as relatively inexpensive processing.

FIG. 1A shows a cross-sectional view of an example multilayer structure 100 according to a principle herein. The multilayer structure 100 includes conductive layers 110 and 115, negative differential resistance (NDR) material layers 120 and 125, and a layer 130. Layer 130 is comprised of a conductive material 135a, 135b, 135c interspersed with regions of a dielectric material 140-1 and 140-2. The regions of dielectric material 140-1 and 140-2 are separated by the conductive material in the x-direction.

Conductive lines 110 and 115 can be formed from a metal, a metallic oxide, a metallic nitride, or a transparent conducting oxide, or some combination thereof. As non-limiting examples, the conductive lines 110 and 115 can be formed from titanium nitride, tantalum nitride, copper, aluminum, or platinum.

Negative differential resistance material (NDR) layers 120 and 125 can be formed from current-controlled negative differential resistance materials. Non-limiting examples of applicable current-controlled negative differential resistance material include oxides of strontium, oxides of barium, oxides of transition metals, or some combination thereof. The transition metal can be Sc, Ti, V, Cr, Mn, Fe, Co, Ni, Cu, Zn, Y, Zr, Nb, Mo, Ru, Rh, Pd, Ag, Cd, La, Hf, Ta, W, Re, Os, Ir, Pt, La, Ce, Pr, Nd, Sm, Eu, Gd, Tb, Dy, Ho, Er, Tm, Yb or Lu. In another non-limiting example, the current-controlled negative differential resistance material can be a chalcogenide glass. For example, current-controlled negative differential resistance has been observed in chalcogenide glasses, including $As_xTe_{100-x-y}Se_y$ (where 25≤x≤60; 10≤y≤25) and $Ge_pAs_qTe_r$ (where p, q, and r are integers (such as $Ge_5As_{38}Te_{57}$). In another example, the negative differential resistance material layers 120 and 125 can be formed from organic layers, such as with a charge channel sandwiched between stacks of solid state layers.

Regarding layer 130, the conductive material 135a, 135b, 135c can be formed from a metal, a metallic oxide, a metallic nitride, or a transparent conducting oxide, or some combination thereof. For example, the conductive material 135a, 135b, 135c can be formed from titanium nitride, tantalum nitride, copper, aluminum, or platinum. The dielectric material 140-1 and 140-2 can be an oxide of silicon, an oxide of aluminum, an oxide of titanium, or some combination thereof. In an example, the dielectric material 140-1 and 140-2 can be a dielectric material that is non-stoichiometric (which includes materials that are not perfectly stoichiometric). For example, dielectric material 140-1 and 140-2 can be $SiO_2$, AlO, or $TiO_2$ that is slightly off stroichiometry. The conductive material can be interspersed with the dielectric material using a lithography process.

Figure 1B:
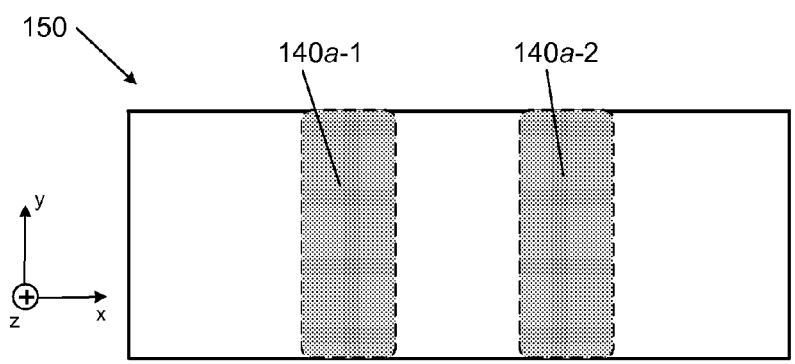
FIG. 1B illustrates a plan view of another example multilayer structure.

FIG. 1B shows a plan view 150 of an example multilayer structure (such as in FIG. 1A) where, in layer 130, each region of the dielectric material 140a-1 and 140a-2 has the same length in the y-direction of multilayer structure 100 as the conductive material 135a, 135b, 135c. In another example of multilayer structure 100, in layer 130, each region of the dielectric material does not have the same length in the y-direction as the conductive material 135a, 135b, 135c, but rather does not span the width of the material. In this example, a different material may be introduced to span the remainder of the width and serve to interrupt the conductive passage between the conductive portions 135a, 135b, 135c of layer 130.

The multilayer structure of FIG. 1A can be operated as an active nonlinear transmission line. The multilayer structure 100 functions as a transmission line based on a signal line (layer 130) being sandwiched between two layers of nonlinear active media (negative differential resistance material layers 120 and 125) that are biased close to their activation thresholds. The negative differential resistance material layers 120 and 125 can be biased, for example, by applying a voltage to each. The nonlinear active medium can be a current-controlled negative differential resistance material that exhibits a current-driven insulator-metal transition. The negative differential resistance material layers 120 and 125 are biased such that the structure remains in the OFF state while the signal line is inactive. When there is some activity on the signal line, such as when a voltage pulse is applied to the signal line, the current-controlled negative differential resistance material can be activated (i.e., changed to ON state). This can initiate the transmission of signals along the multilayer structure. Due to the nonlinearity of this process, features of a neuristor are derived. There is a thresholding behavior which eliminates certain activity on the signal line (described in connection with FIGS. 3A and 3B). The transmitted signal is conditioned by the multilayer structures (described in connection with FIGS. 5A and 5B). There is a refractory period after activation during which the multilayer structure cannot be activated (described in connection with FIGS. 6A and 6B).

Figure 1C:
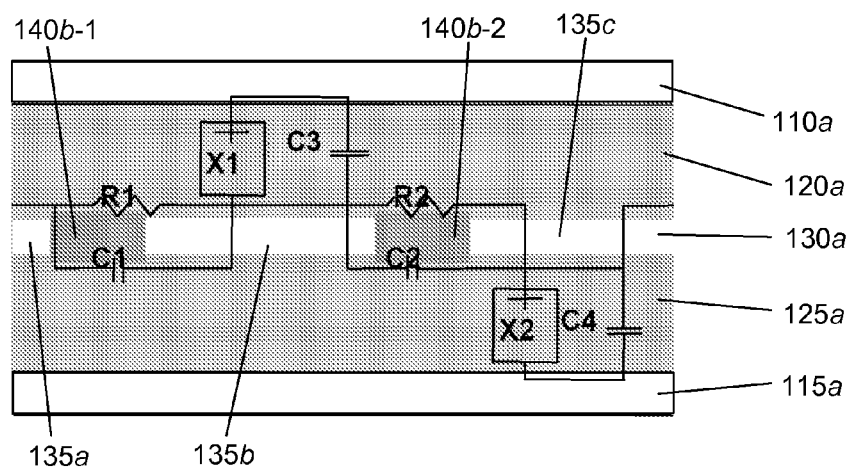
FIG. 1C illustrates a lumped circuit diagram relative to a cross-section view of the example multilayer structure of FIG. 1A.

FIG. 1C shows a lumped circuit diagram representation superimposed over the multilayer structure cross-section of FIG. 1A. The lumped circuit diagram uses discrete elements to represent the electronic behavior of the portions of the multilayer structure, i.e., conductive layers 110a and 115a, NDR material layers 120a and 125a, and layer 130a. Layer 130a is shown as including the conductive material in regions 135a, 135b, and 135c, and interspersed with regions of dielectric material 140b-1 and 140b-2. The unit cell of the lumped circuit includes four parallel resistor-capacitor (RC) circuit components. The first RC circuit represents the equivalent resistive (R1) and capacitive (C1) components between conductive material 135a and 135b and dielectric 140b-1. The second RC circuit represents the negative resistive (X1) and capacitive (C3) components between conductive material 135b and 110a and NDR material 120a. NDR material 120a can exhibit a capacitive effect with non-zero leakage current, and so can contribute to both the negative resistive (X1) and capacitive (C3) components. The third RC circuit represents the equivalent resistive (R2) and capacitive (C2) components between conductive material 135b and 135c and dielectric 140b-2. The fourth RC circuit represents the negative resistive (X2) and capacitive (C4) components between conductive material 135b and 115a and NDR material 125a. Similarly to NDR material 120a, NDR material 125a can exhibit a capacitive effect with non-zero leakage current, and so can contribute to both the negative resistive (X2) and capacitive (C4) components. The overall lumped circuit representation behaves as metal layers that are disrupted by dielectric components. The electronic properties of the multilayer structure can be modified by changing the materials and/or thicknesses of the different layers of the structure. As a non-limiting example, the type of materials and/or thickness of layer 130a can be changed to modify the R1 and R2 terms of the lumped circuit diagram. The type of dielectric material and/or the degree of disruption in the stoichiometry of the dielectric material of layer 130a can be changed to modify the C1 and C2 term of the lumped circuit diagram. Similarly, the type of materials and/or thicknesses of the NDR layers can be changed to modify the C3 and C4 term of the lumped circuit diagram. The type of materials and/or thickness of layer 130a can be changed to modify the R1 and R2 terms of the lumped circuit diagram.

In operation, the negative differential resistance material layers 120a and 125a are biased such that the multilayer structure remains in the OFF state while the signal line (layer 130a) is inactive. When the signal line is activated, e.g., when a potential is applied at conductive portion 135a, capacitive element C1 of the first RC circuit is charged. Capacitive element C1 discharges by current flow through R1 and the second RC circuit (X1C3) until the voltage across the capacitive element C1 returns to baseline. During this discharge process, capacitive element C3 is charged. Capacitive element C3 discharges as described for the first RC circuit to charge the third RC circuit (R2C2). The same process applies for the third RC circuit discharging and the fourth RC circuit (X2C4) being charged. In this way, a potential applied at one end of the multilayer structure propagates along the signal line to the other end of the multilayer structure (a transmission line).

Figure 2A:
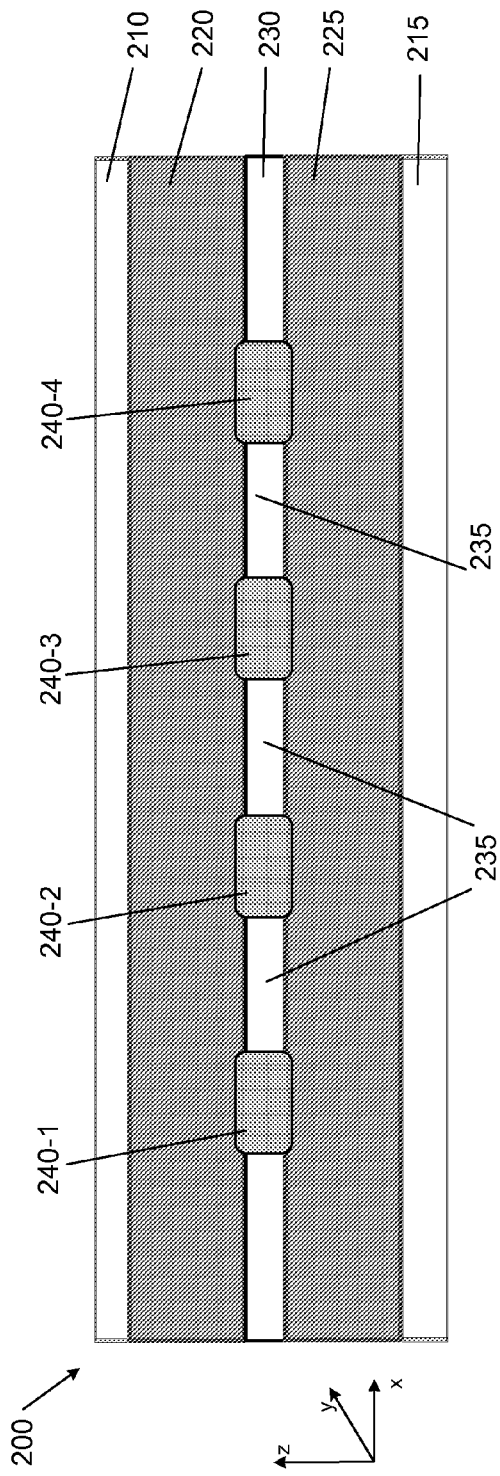
FIG. 2A illustrates a cross-section view of another example multilayer structure.

FIG. 2A shows a cross-sectional view of another example multilayer structure 200 according to a principle herein. The multilayer structure 200 includes conductive layers 210 and 215, negative differential resistance (NDR) material layers 220 and 225, and a layer 230. Layer 230 is comprised of a conductive material 235 interspersed with four regions of a dielectric material 240-1, 240-2, 240-3 and 240-4. The regions of dielectric material 240-1, 240-2, 240-3 and 240-4 are separated by the conductive material in the x-direction.

The materials described in connection with the conductive layers 110 and 115 and negative differential resistance (NDR) material layers 120 and 125 are also applicable to the corresponding components of multilayer structure 200. The materials described in connection with the conductive material 135a, 135b, 135c and dielectric material 140-1 and 140-2 of layer 130 also apply to the conductive material 235 and dielectric material 240-i (i=1, . . . , 4) of layer 230.

Figure 2B:
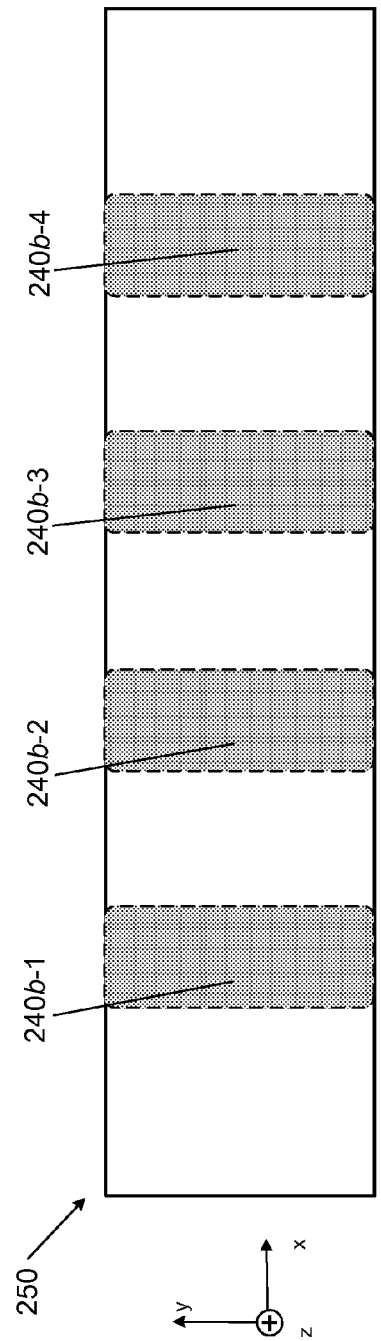
FIG. 2B illustrates a plan view of another example multilayer structure.

FIG. 2B shows a plan view 250 of an example multilayer structure (such as in FIG. 2A) where, in layer 230, each region of the dielectric material 240-i (i=1, . . . , 4) has the same length in the y-direction of multilayer structure 200 as the conductive material 235. In another example of multilayer structure 200, in layer 230, each region of the dielectric material does not have the same length in the y-direction as the conductive material 235, but rather does not span the width of the material. In this example, a different material may be introduced to span the remainder of the width and serve to interrupt the conductive passage between the conductive portions 235 of layer 230.

Figure 2C:
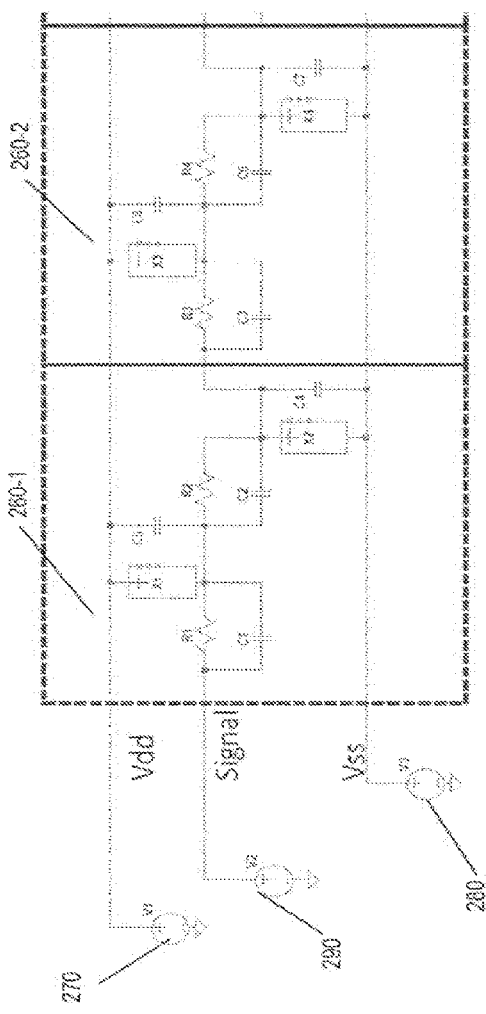
FIG. 2C illustrates a lumped circuit diagram of the example multilayer structure of FIG. 2A.

FIG. 2C shows a lumped circuit diagram representation of the multilayer structure 200 of FIG. 2A. The lumped circuit diagram of FIG. 2C includes two of the unit cells shown in connection with FIG. 1C. Each unit cell of the lumped circuit includes four parallel resistor-capacitor (RC) circuit components. Similarly to as described in connection with FIG. 1C, the first RC circuit of the first unit cell 280-1 represents equivalent resistive (R1) and capacitive (C1) components between portions of the conductive material 235 and dielectric 240-1. The second RC circuit represents the negative resistive (X1) and capacitive (C3) components between conductive material 235 and 210 and NDR material 220. The third RC circuit represents the equivalent resistive (R2) and capacitive (C2) components between portions of conductive material 235 and dielectric 240-2. The fourth RC circuit represents the negative resistive (X2) and capacitive (C4) components between conductive material 235 and 215 and NDR material 225. The equivalent RC circuit components of the second unit cell 280-2 are as described for the first unit cell 280-1, except with dielectric components 240-3 and 240-4 used for the first and third RC circuit components of the second unit cell 280-2.

As depicted in FIG. 2C, NDR material layer 220 is biased at a voltage $V_{dd}$ and NDR material layer 225 is biased at a voltage $V_{ss}$. The NDR layers are biased such that the multilayer structure remains in the OFF state while the signal line (layer 130a) is inactive. In an example, a voltage source 270 applies $V_{dd}$, a positive voltage, to NDR material layer 220 via conductive layer 210, and a voltage source 280 applies $V_{ss}$, a negative voltage, to NDR material layer 225 via conductive layer 215. When the signal line is activated, e.g., when a voltage source 290 applies a voltage pulse to layer 235, the voltage pulse activates a signal which propagates along signal line layer 235 as described in connection with FIG. 1C. In brief, the voltage pulse charges capacitive element C1 of the first RC circuit, and the discharge of capacitive element C1 charges capacitive element C3 of the second RC circuit. The discharge of capacitive element C3 charges the third RC circuit (R2C2), whose discharge charges the fourth RC circuit (X2C4). Discharge of the fourth RC circuit of the first unit cell charges the first RC circuit of the second unit cell, and the sequence continues to cause a signal to propagate along the multilayer structure (a transmission line).

In another example, the multilayer structure includes top and bottom conductive layers, negative differential resistance material layers positioned between the top and bottom conductive layers, and a signal layer positioned between the negative differential resistance material layers. In this example, the signal layer is comprised of a conductive material interspersed with multiple separated regions of the dielectric material in a periodic pattern along an x-direction of the multilayer structure. In a non-limiting example, the signal layer of the multilayer structure includes the conductive material interspersed with multiple separated regions of the dielectric material in a periodic pattern that corresponds to a lumped circuit of ten or more unit cells.

Figure 4:
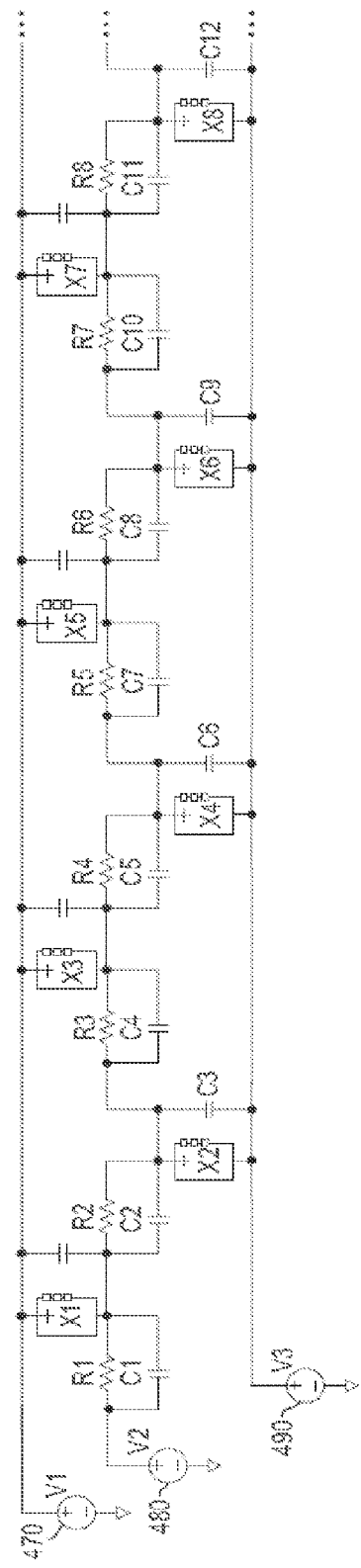
FIG. 4 shows portions of a lumped circuit diagram of another example multilayer structure.

FIGS. 3A, 3B, and 5A through 6B show the results of example computations of the response of an example multilayer structure similar to that of FIG. 2A, but including ten unit cells of the lumped circuit according to the principles herein. Portions of the lumped circuit of ten unit cells are shown in FIG. 4. The computation is based on a voltage source 470 applying a voltage Vdd of about +0.9V to the top conductive layer of the example multilayer structure, and a voltage source 480 applying a voltage Vss of about −0.9V to the bottom electrode. A voltage source 490 applies the voltage pulse VSignal to the signal line.

Figure 3A:
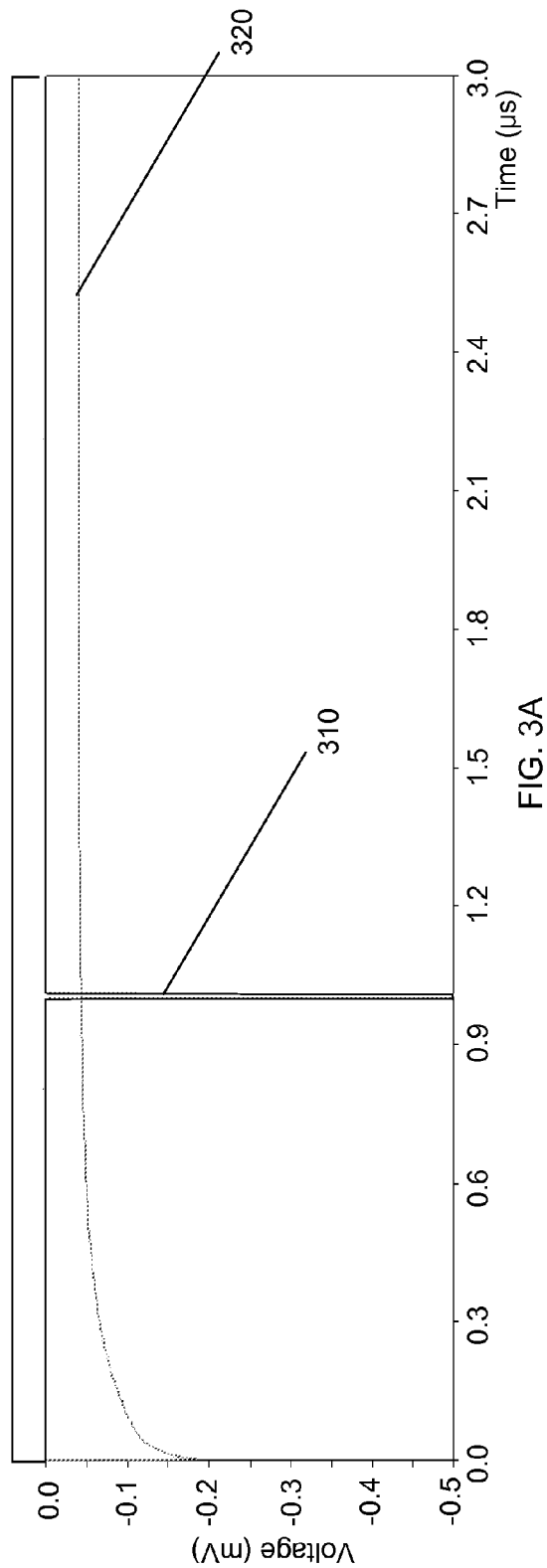
FIGS. 3A and 3B show example computation results of the response of a multilayer structure to a signal pulse of −0.5V (FIG. 3A) and −0.8V (FIG. 3B).
Figure 3B:
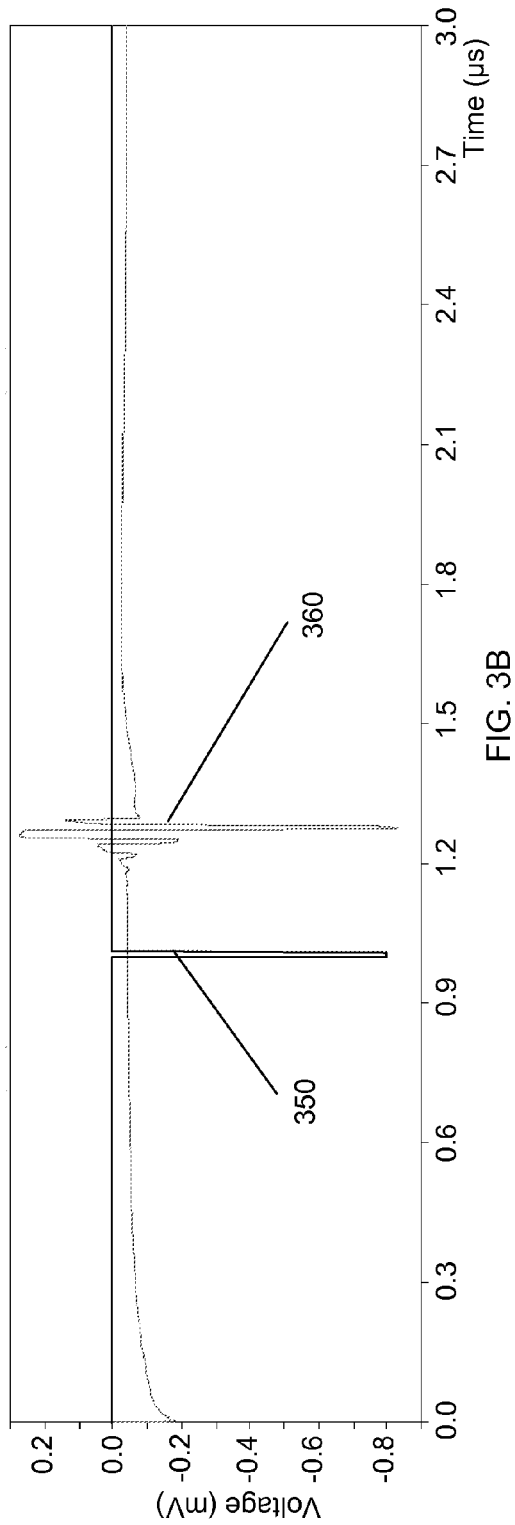

FIGS. 3A and 3B demonstrate the property of thresholding of the multilayer structure, where there is an activation threshold before the multilayer structure transmits a signal. In FIG. 3A, a voltage pulse 310 of $V_{Signal}$=−0.5V is applied to the signal line for about 10 ns at around time point 1.0 μs to the multilayer structure. The response 320 of the multilayer structure shows no signal activation. In FIG. 3B, a voltage pulse 350 of $V_{Signal}=-0.8V$ is applied to the signal line for about 10 ns at around time point 1.0 µs to the multilayer structure. The response of the multilayer structure shows activation of a signal 360 starting at around time point 1.2 µs. Thus, a voltage of $V_{Signal}=-0.5V$ was not enough to activate a signal, but a voltage of $V_{signal}=-0.8V$ was enough to activate the signal. It is estimated that the activation threshold of this example multilayer structure is about $V_{Signal}=-0.7V$.

FIGS. 5A and 5B demonstrate the property of pulse-shaping, where the multilayer structure shows little sensitivity to input pulse width, and the transmitted signal is conditioned by the multilayer structure. In FIG. 5A, a voltage pulse 510 of $V_{Signal}=-0.8V$ is applied to the signal line for about 100 ns, starting at around time point 1.0 µs to the multilayer structure. The response 520 of the multilayer structure shows activation of a signal 520 starting at around time point 1.2 µs. In FIG. 5B, a voltage pulse 550 of $V_{Signal}=-0.8V$ is applied to the signal line for about 10 ns at around time point 1.0 µs to the multilayer structure. The response of the multilayer structure shows activation of a signal 560 starting at around time point 1.2 µs. Signals 520 and 560 exhibit similar duration and pulse shape. Thus, pulses of differing durations (100 ns long vs 10 ns long) still derived basically the same signal response width over the same time period. FIGS. 5A and 5B also demonstrate potentiation, a long-lasting enhancement in signal transmission along the multilayer structure.

FIGS. 6A and 6B demonstrate the refractory period, the time during which it is not possible to initiate a subsequent signal on the multilayer structure after it has been fired. In FIG. 6A, five voltage pulses 610, each of 10 ns duration, and each of $V_{Signal}=-0.8V$, are applied over a total period of 100 ns to the signal line of the multilayer structure, starting at around time point 1.0 µs. The response 520 of the multilayer structure shows activation of a single signal 620 starting at around time point 1.2 µs. In FIG. 5B, five voltage pulses 650i (i=a, ..., e), each of 10 ns duration, and each of $V_{Signal}=-0.8V$, are applied at regular intervals over a total period of 1.2 µs to the signal line of the multilayer structure, starting at around time point 1.0 µs. Each of these more widely-spaced voltage pulses activated corresponding signal 660i (i=a, ..., e). Each signal 660i (i=a, ..., e) has the same pulse-shape and width. The multilayer structure does not show activation of multiple signals in response to rapid spiking at the input, but does show multiple signal responses to slower spiking at the input. Thus, the multilayer structure does not respond when there are multiple pulses very closely spaced in time over a short time interval. The pulses can be transmitted as a signal through the multilayer structure if the incoming pulses are widely separated. The multilayer structure does respond when the pulses are at intervals farther apart than a refractory period. From FIG. 6B, the refractory period appears to be close to the time period for a previous pulse to die out. From FIG. 6A, it is seen that incoming pulses are skipped and not transmitted if the time interval between them is shorter than the refractory period.

FIG. 7 shows a cross-sectional view of another example multilayer structure 700 according to a principle herein. The multilayer structure 700 includes conductive layers 710 and 715, negative differential resistance material layers 720 and 725, and layer 730. Layer 730 is comprised of a layer of dielectric material 740 and regions of a conductive material 735 disposed above and below the dielectric material. The regions of conductive material 735 are separated by the negative differential resistance material in the x-direction.

The materials described in connection with the conductive layers 110 and 115 and negative differential resistance (NDR) material layers 120 and 125 of FIG. 1A are also applicable to the corresponding conductive layers 710 and 715 and negative differential resistance material layers 720 and 725 of multilayer structure 700. The materials described in connection with the conductive material 135a, 135b, 135c and dielectric material 140-1 and 140-2 of layer 130 of FIG. 1A also apply to the conductive material 735 and dielectric material 740 of layer 730.

FIG. 8 shows a cross-sectional view of another example multilayer structure 800 according to a principle herein. The multilayer structure 800 includes conductive layers 810 and 815, negative differential resistance material layers 820 and 825, and layer 830. Conductive layers 810 and 815 are illustrated as broken into multiple separate regions. Layer 830 is comprised of a layer of dielectric material 840 and regions of a conductive material 835 disposed above and below the dielectric material. The regions of conductive material 835 are separated by the negative differential resistance material in the x-direction.

The materials described in connection with the conductive layers 110 and 115 and negative differential resistance (NDR) material layers 120 and 125 of FIG. 1A are also applicable to the corresponding conductive layers 810 and 815 and negative differential resistance material layers 820 and 825 of multilayer structure 700. The materials described in connection with the conductive material 135a, 135b, 135c and dielectric material 140-1 and 140-2 of layer 130 of FIG. 1A also apply to the conductive material 835 and dielectric material 840 of layer 830.

FIG. 9 shows a unit cell of a lumped circuit element representation that applies to both multilayer structure 700 and multilayer structure 800. The unit cell includes four parallel resistor-capacitor (RC) circuit components. The first RC circuit represents the transmission line capacitance, $C_{TL}$, and the resistive element contributed to by the negative differential resistance material. The transmission line capacitance, $C_{TL}$, can be determined from the area, the thickness, and the type of dielectric of the negative differential resistance material between the overlap of the conductive layer 710 and conductive material 735 of FIG. 7 (and for FIG. 8, the conductive layer 810 and conductive material 835). The width of this overlap is shown at 750 and 850 in FIG. 7 and FIG. 8, respectively. The second RC circuit represents the coupling capacitance, $C_{cp}$, and the coupling resistance, $R_{cp}$, due to the overlap of conductive materials 735 disposed above and below dielectric material 740 of FIG. 7 (and for FIG. 8, conductive materials 835 disposed above and below dielectric material 840). The coupling capacitance, $C_{cp}$, can be determined from the width of the overlap shown at 760 and 860 in FIG. 7 and FIG. 8, respectively, and the dielectric constant and thickness of the dielectric material (740 and 840, respective to FIGS. 7 and 8) in the overlap regions 760 and 860. The coupling resistance, $R_{cp}$, can be determined from the material conductivity, thickness, and area in the overlap regions 760 and 860. The third RC circuit represents the transmission line capacitance, $C_{TL}$, and the resistive element is contributed by the negative differential resistance material in the overlap shown at 770 and 870 in FIG. 7 and FIG. 8, respectively. The fourth RC circuit represents the coupling capacitance, $C_{cp}$, and the coupling resistance, $R_{cp}$, due to the overlap of conductive materials shown at 780 and 880 in FIG. 7 and FIG. 8, respectively.

The multilayer structure of FIGS. 7 and 8 can be operated as transmission lines as described in connection with FIGS. 1C and 2C. The upper NDR material layers of FIG. 7 and FIG. 8 are biased at a positive voltage $V_{dd}$ and the lower NDR material layers of FIG. 7 and FIG. 8 are biased at a negative voltage $V_{ss}$. The NDR layers are biased such that the multilayer structure remains in the OFF state while their respective signal lines (layer 730 and 830) are inactive. When the signal line is activated by applying a voltage pulse to layer 735 or 835, respective to FIG. 7 and FIG. 8, the voltage pulse activates a signal which propagates along signal line layer 735 (or 835) as described in connection with FIGS. 1C and 2C. As shown in FIG. 9, the voltage pulse charges capacitive element $C_{TL}$ of the first RC circuit, and the discharge of capacitive element $C_{TL}$ charges capacitive element $C_{cp}$ of the second RC circuit. The discharge of capacitive element $C_{cp}$ charges the third RC circuit, whose discharge charges the fourth RC circuit ($C_{cp}R_{cp}$). Discharge of the fourth RC circuit of the first unit cell charges the first RC circuit of the next unit cell, and the sequence continues to cause a signal to propagate along the multilayer structure (a transmission line).

In another example, the multilayer structure includes top and bottom conductive layers, negative differential resistance material layers positioned between the top and bottom conductive layers, and a signal layer positioned between the negative differential resistance material layers. In this example, the signal layer is comprised of a conductive material. The materials described in connection with the conductive layers 110 and 115 and negative differential resistance (NDR) material layers 120 and 125 of FIG. 1A are also applicable to the corresponding conductive layers and negative differential resistance material layers of this example multilayer structure. The materials described in connection with the conductive material 135a, 135b, 135c also apply to the conductive material of the signal line of this example multilayer structure. This example multilayer structure exploits a parasitic capacitance (C1, C2) between the conductive layers at the top and bottom of the multilayer structure and the signal layer. The thickness of the signal layer can be changed to modify resistive terms R1, R2 term of a lumped circuit representation of this structure. This example multilayer structure can be operated as a transmission line as described herein.

A composite device is also provided. The composite device can be formed from linking, using a bridge, at least two of any of the multilayer structures described herein (including the multilayer structures described in connection with any of FIGS. 1A, 1B, 2A, 2B, 7 and 8). The bridge includes a memristive device that electrically couples to a conductive portion of the signal layer of each of the multilayer structures that are bridged. The memristive device of the bridge facilitates dynamically changing connections between the multilayer structures.

Figure 10:
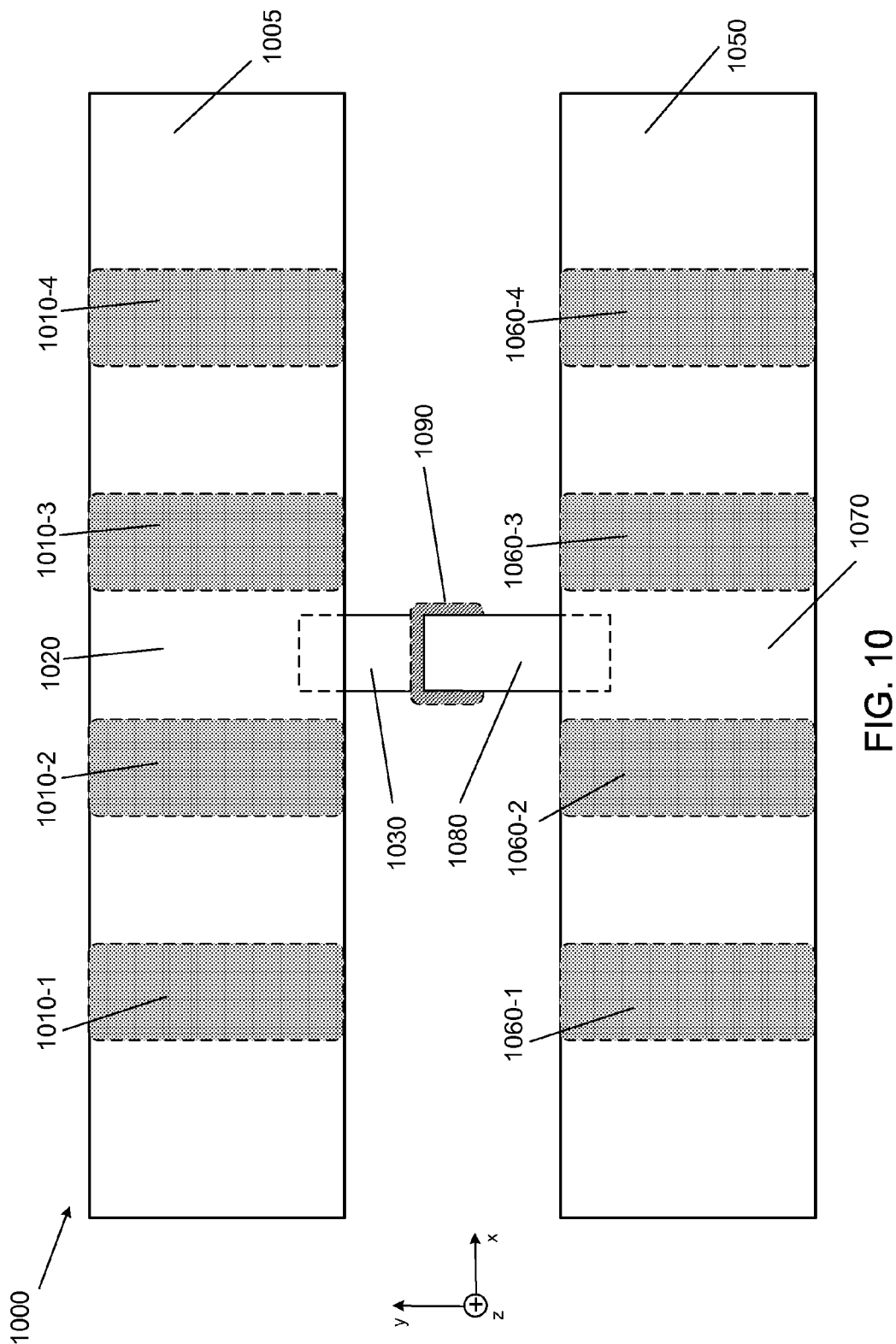
FIG. 10 illustrates a plan view of another example electronic device that includes two multilayer structures linked by a bridge.

In a non-limiting example, FIG. 10 shows a plan view of an example electronic device 1000 according to a principle herein. The electronic device 1000 includes two multilayer structures 1005 and 1050 linked by a bridge 1090. Multilayer structures 1005 can be any structure described in connection with any of FIGS. 1A, 1B, 2A, 2B, 7 and 8. The bridge 1090 includes a memristive device that electrically couples to a conductive portion of the signal layer of each of the multilayer structures that are bridged. In the illustration of FIG. 10, the multilayer structures are those described in connection with FIGS. 2A and 2B. The signal line of each multilayer structure includes conductive material interspersed with dielectric material 1010-$i$ ($i=1,\ldots,4$) an 1060-$j$ ($j=1,\ldots,4$). As depicted in FIG. 10, an electrical contact is established between the bottom surface 1030 of the bridge 1090 and a conductive portion 1020 of the signal layer of multilayer structure 1005. An electrical contact is established between the top surface 1080 of the bridge 1090 and a conductive portion 1070 of the signal layer of multilayer structure 1050.

Figure 11:
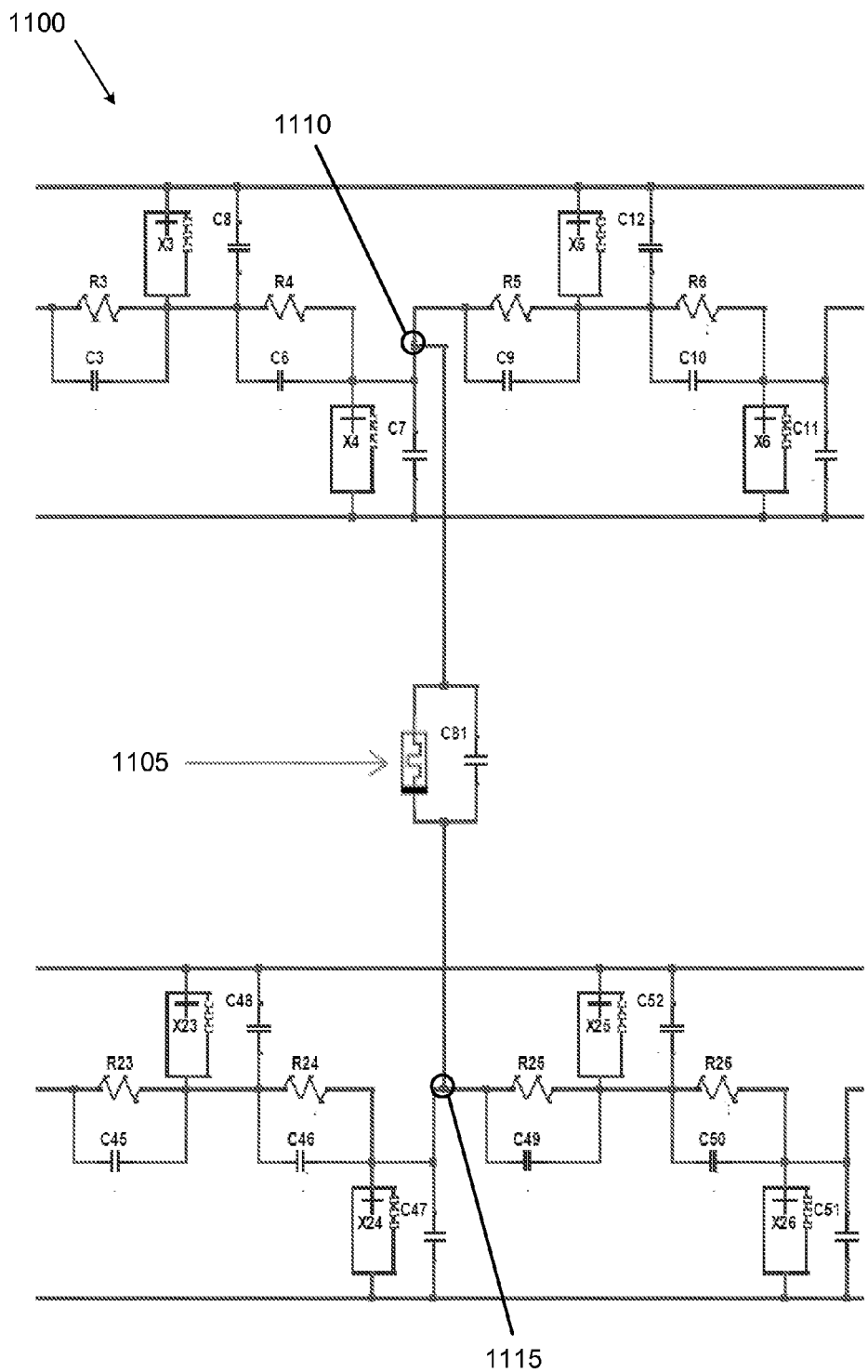
FIG. 11 illustrates a lumped circuit diagram of the electronic device of FIGS. 7 and 8.

FIG. 11 shows a lumped circuit diagram representation of an electronic device that includes two of the multilayer structures described in connection with FIGS. 2A and 2B, linked by a bridge that includes a memristive device. The structural correspondence and operation of the RC circuits of the lumped circuit of FIG. 11 are as described in connection with multilayer structure of FIGS. 2A and 2B. The bridge 1105 is indicated in the lumped circuit as a memristor in parallel with a capacitive component. The contact points that the bridge makes with the signal lines of the multilayer structures are indicated at 1110 and 1115.

Figure 12A:
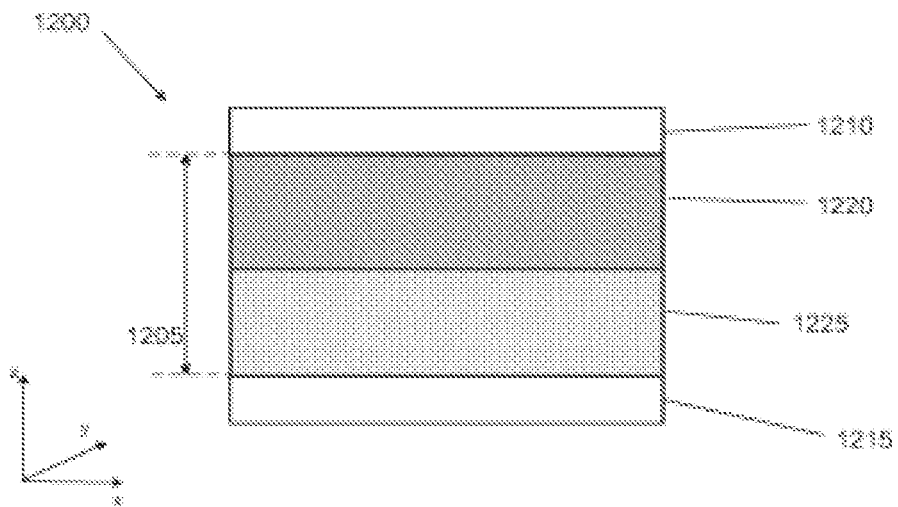
FIGS. 12A and 12B illustrate cross-section views of example memristive devices.

FIG. 12A shows an example memristive device 1200 according to a principle described herein. The memristive device 1200 includes an active region 1205 disposed between a first electrode 1210 and a second electrode 1215. The active region 1205 including a switching layer 1220 and a conductive layer 1225 formed of a dopant source material. The insulating layer 1220 is formed of a switching material capable of carrying a species of dopants and transporting the dopants under an applied potential. The conductive layer 1225 is disposed between and in electrical contact with the switching layer 1220. Conductive layer 1225 is formed of a dopant source material that includes the species of dopants that are capable of drifting into the switching layer under the applied potential and thus changing the conductance of memristive device 1200. When a potential is applied to memristive device 1200 in a first direction, the switching layer develops an excess of the dopants. When the direction of the potential is reversed, the voltage potential polarity is reversed, and the drift direction of the dopants is reversed. The switching layer develops a deficiency of dopants.

Figure 12B:
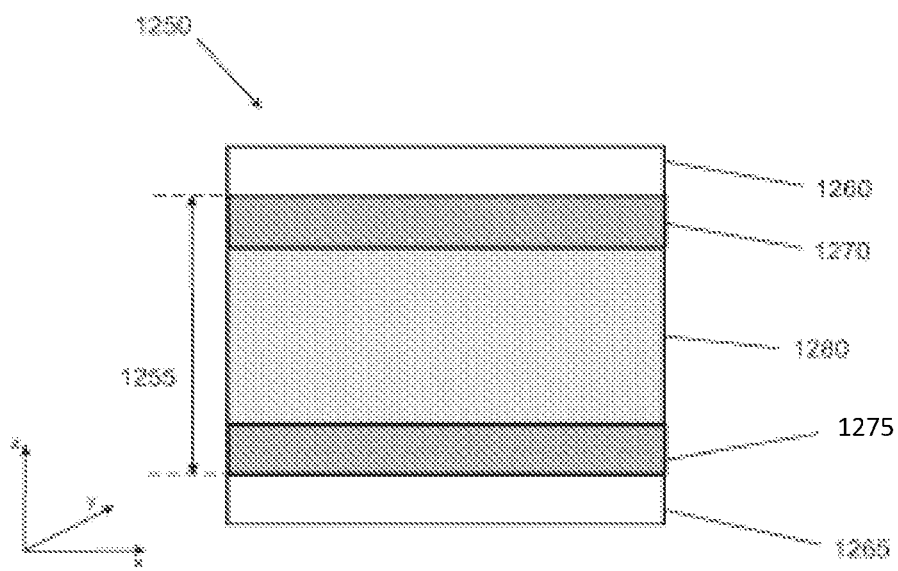

FIG. 12B shows another example memristive device 1250 according to principles described herein. The memristive device 1250 includes an active region 1255 disposed between first electrode 1260 and second electrode 1265. The active region 1205 including two switching layers 1270, 1275 and a conductive layer 1280 formed of a dopant source material. The switching layers 1270, 1275 are each formed of a switching material capable of carrying a species of dopants and transporting the dopants under an applied potential. The conductive layer 1280 is disposed between and in electrical contact with the switching layers 1270, 1275. Conductive layer 1280 is formed of a dopant source material that includes the species of dopants that are capable of drifting into the switching layers under the applied potential and thus changing the conductance of memristive device 1250. When a potential is applied to memristive device 1250 in a first direction (such as in the positive z-axis direction), one of the switching layers develops an excess of the dopants and the other switching layer develops a deficiency of the dopants. When the direction of the potential is reversed the voltage potential polarity is reversed, and the drift direction of the dopants is reversed. The first switching layer develops a deficiency of dopants and the other switching layer develops an excess of dopants.

Typically, the switching material is an electronically insulating, semiconducting, or a weak ionic conductor. For example, the switching material can be a highly insulating stoichiometric compound. Examples of the switching material include an oxide of aluminum, an oxide of titanium (including $TiO_2$), an oxide of silicon (including $SiO_2$), an oxide of gallium, an oxide of germanium, and an oxide of a transition metal (including oxides of Sc, Ti, V, Cr, Mn, Fe, Co, Ni, Cu, Zn, Y, Zr, Nb, Mo, Hf, Ta, W, or Re). In non-limiting examples, the switching material is $TiO_2$, $TaO_x$, where $0 < x \leq 2.5$, or NiO. Other examples of the switching material include a nitride of aluminum (including AlN), a nitride of silicon, a nitride of gallium, a nitride of germanium, and a nitride of a transition metal (including nitrides of Sc, V, Cr, Mn, Fe, Co, Ni, Cu, Zn, Y, Zr, Nb, Mo, Hf, and Re).

The dopant source material is the source of the doping species for the switching material, and includes a relatively high concentration of dopants of the type that can be transported by the switching material. However, the dopant source material differs from the switching material by at least one metal ion. That is, the metal oxides of the switching layer and the conductive layer differ by at least one metal ion. The result is formation of a hetero-junction between the switching layer and the conductive layer. Examples of dopant source material include titanium sulphide, titanium phosphide, $Ti_4O_7$, $TiO_{2-x}$ ($0<x<1$), $AlN_{1-w}$ ($0<w<0.2$), a ternary system (e.g., $SrTiO_{1-y}$ ($0<y\leq0.2$)), or a quaternary system. In non-limiting examples, the dopant source material is $RuO_2$, $WO_z$, where $0<z\leq3$. The type of dopant depends on the type of dopant source material and switching material used. For example, in a system where the dopant source material $AlN_{1-w}$, is used with switching material AlN, the dopant is nitrogen vacancies. For example, where the dopant source material is $Ti_4O_7$, the dopant is oxygen vacancies.

In operation, memristive devices 1200 and 1250 can be switched (i.e., changed between a high resistance and a low resistance state) when a potential is applied across their electrodes. A voltage of sufficiently high magnitude across the points of contacts that the bridge makes with the signal line of the multilayer structures can switch the memristive device from a high resistance state to a low resistance state that allows current flow. In the example lumped circuit diagram of FIG. 11, the contact points that the bridge makes with the signal lines are indicated at 1110 and 1115. A sufficiently high voltage across the bridge points (e.g., points 1110 and 1115) could result in current flow from one multilayer structure to the other. The result can be transfer of a signal from one multilayer structure to the other. In this manner, the memristive device of the bridge of the electronic device facilitates dynamically changing connections between the multilayer structures. The composite device exhibits electronic characteristics of neurons linked by a synapse.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A device comprising at least one multilayer structure, said multilayer structure comprising:
   a first conductive layer;
   a first layer and a second layer of negative differential resistance material on said first conductive layer;
   a signal line layer disposed between said first and second layers of negative differential resistance material;
   a second conductive layer, said layers of negative differential resistance material and said signal line layer being disposed between said first and second conductive layers; and
   a signal voltage source to send a signal down said signal line layer, with different voltage signals being applied to said first and second layers of negative differential resistance material such that, with the signal layer sandwiched between the first and second layers of negative differential resistance material receiving said voltage signals, the signal line layer is a non-linear signal transmission line.

2. The device of claim 1, wherein signal line layer comprises conductive material interspersed with at least two regions of dielectric material.

3. The device of claim 1, wherein signal line layer comprises conductive material interspersed with multiple separated regions of dielectric material in a periodic pattern along the signal line layer.

4. The device of claim 1, wherein signal line layer comprises a layer of dielectric material and regions of conductive material disposed above and below the layer of dielectric material, and wherein each region of conductive material disposed above the dielectric material overlaps, in a direction vertically through all of said layers, at least one of the regions of conductive material disposed below the dielectric material.

5. The device of claim 1, wherein either of the conductive layers comprises a metal, a metallic oxide, a metallic nitride, or a transparent conducting oxide, or a combination thereof.

6. The device of claim 1, wherein either the first or second layer of negative differential resistance material comprises current-controlled negative differential resistance material, and wherein the current-controlled negative differential resistance material comprises a chalcogenide glass, an oxide of strontium, an oxide of barium, an oxide of a transition metal, or some combination thereof, wherein the transition metal is Se, Ti, V, Cr, Mn, Fe, Co, Ni, Cu, Zn, Y, Zr, Nb, Mo, Ru, Rh, Pd, Ag, Cd, La, Hf, Ta, W, Re, Os, Ir, Pt, La, Ce, Pr, Nd, Sm, Eu, Gd, Tb, Dy, Ho, Er, Tm, Yb or Lu.

7. The device of claim 1, wherein the signal layer comprises segments of conductive material comprising titanium nitride, tantalum nitride, copper, platinum, or a combination thereof.

8. The device of claim 1, wherein the signal layer comprises dielectric material that is nonstoichiometric.

9. The device of claim 8, wherein the dielectric material is an oxide of silicon, an oxide of aluminum, an oxide of titanium, or a combination thereof.

10. The device of claim 1, further comprising:
    a second multilayer structure comprising first and second conductive layers, first and second layers of negative differential resistance material and a signal line layer as recited in claim 1; and
    a bridge disposed between the two multilayer structures;
    wherein the bridge comprises a memristive device; and
    wherein the bridge electrically couples to a conductive portion of the signal line layer of each of the multilayer structures.

11. The device of claim 10, wherein the memristive device comprises:
    a first electrical contact at a first surface; and
    a second electrical contact at a second surface;
    wherein the first electrical contact electrically couples to the conductive portion of the signal line layer of one of the multilayer structures, and wherein the second electrical contact electrically couples to the conductive portion of signal line layer of the other multilayer structures.

12. The device of claim 11, wherein the memristive device comprises:
    an active region disposed between and in electrical contact with the first and second electrical contacts, the active region having two switching layers formed of a switching material capable of carrying a species of dopants and transporting the dopants under an applied potential and a conductive layer disposed between and in electrical contact with the switching layers, the conductive layer being formed of a dopant source material that includes the species of dopants that are capable of drifting into the switching layers under the applied potential.

13. The device of claim 12, wherein the switching material comprises an oxide of aluminum, an oxide of silicon, an oxide of gallium, an oxide of germanium, or an oxide of a transition metal including Sc, Ti, V, Cr, Mn, Fe, Co, Ni, Cu, Zn, Y, Zr, Nb, Mo, Hf, Ta, W, and Re.

14. The device of claim 12, wherein the switching material comprises a nitride of aluminum, a nitride of silicon, a nitride of gallium, a nitride of germanium, or a nitride of a transition metal including Sc, V, Cr, Mn, Fe, Co, Ni, Cu, Zn, Y, Zr, Nb, Mo, Hf, and Re.

15. The multilayer structure of claim 1, wherein said multilayer structure forms a circuit comprising:
a resistor and capacitor in parallel;
a capacitor and a negative differential resistance element in parallel connected to said resistor and capacitor in parallel; and
a second resistor and capacitor in parallel connected to an opposite side of the capacitor and negative differential resistance element in parallel.

16. The multilayer structure of claim 1, wherein the first and second conductive layers are divided into discrete regions of spaced apart conductive material with gaps therebetween.

17. A circuit formed from a multilayer structure comprising:
a plurality of resistor and capacitor pairs, each pair connected in parallel;
a plurality of capacitor and a negative differential resistance element pairs, each pair connected in parallel;
wherein a non-linear signal transmission line comprises said resistor and capacitor pairs alternating between said capacitor and differential resistant element pairs along said non-linear signal transmission line,
wherein elements of said circuit are formed by said multilayer structure, said multilayer structure comprising:
a first conductive layer;
a first layer and a second layer of negative differential resistance material on said first conductive layer;
a signal line layer disposed between said first and second layers of negative differential resistance material and comprising regions of conductive material and regions of dielectric material; and
a second conductive layer, said layers of negative differential resistance material and said signal line layer being disposed between said first and second conductive layers.

18. The circuit of claim 17, wherein said signal line layer comprises the regions of conductive material interspersed with multiple regions of the dielectric material in a periodic pattern along a line between the first and second layers of negative differential resistance material.

19. The circuit of claim 17, wherein the negative differential resistance material is current-controlled negative differential resistance material, and wherein the current-controlled negative differential resistance material comprises a chalcogenide glass, an oxide of strontium, an oxide of barium, an oxide of a transition metal, or some combination thereof, wherein the transition metal is Sc, Ti, V, Cr, Mn, Fe, Co, Ni, Cu, Zn, Y, Zr, Nb, Mo, Ru, Rh, Pd, Ag, Cd, La, Hf, Ta, W, Re, Os, Ir, Pt, La, Ce, Pr, Nd, Sm, Eu, Gd, Tb, Dy, Ho, Er, Tm, Yb or Lu.

20. The circuit of claim 17, wherein the dielectric material is a nonstoichiometric oxide of silicon, a nonstoichiometric oxide of aluminum, or a nonstoichiometric oxide of titanium.

21. The circuit of claim 17, wherein signal line layer comprises a layer of dielectric material and regions of conductive material disposed above and below the layer of dielectric material, and wherein each region of conductive material disposed above the dielectric material overlaps, in a direction vertically through all of said layers, at least one of the regions of conductive material disposed below the dielectric material.

22. A multilayer structure comprising:
a conductive layer M1;
a layer NDR1 disposed above the conductive layer M1 in a z-direction of the multilayer structure, wherein layer NDR1 comprises a first negative differential resistance material;
a layer M2 disposed above layer NDR1 in the z-direction, wherein layer M2 comprises a layer of a dielectric material and regions of a conductive material disposed above and below the dielectric material, wherein the regions of conductive material are separated by regions of the negative differential resistance material in an x-direction of the multilayer structure, wherein each region of the conductive material disposed above the dielectric material overlaps, in the x-direction, at least one of the regions of the conductive material disposed below the dielectric material by an amount less than the width of the conductive material, and wherein each region of the conductive material has a same length as the dielectric material in a y-direction of the multilayer structure;
a layer NDR2 disposed above layer M2 in the z-direction, wherein layer NDR2 comprises a second negative differential resistance material; and
a conductive layer M3 disposed above layer NDR2 in the z-direction.

23. The multilayer structure of claim 22, wherein the first negative differential resistance material and the second negative differential resistance material are current-controlled negative differential resistance materials, and wherein the current-controlled negative differential resistance material comprises a chalcogenide glass, an oxide of strontium, an oxide of barium, an oxide of a transition metal, or some combination thereof, wherein the transition metal is Sc, Ti, V, Cr, Mn, Fe, Co, Ni, Cu, Zn, Y, Zr, Nb, Mo, Ru, Rh, Pd, Ag, Cd, La, Hf, Ta, W, Re, Os, Ir, Pt, La, Ce, Pr, Nd, Sm, Eu, Gd, Tb, Dy, Ho, Er, Tm, Yb or Lu.

24. The multilayer structure of claim 22, wherein the dielectric material of layer M2 is a nonstoichiometric oxide of silicon, a nonstoichiometric oxide of aluminum, or a nonstoichiometric oxide of titanium.

* * * * *

UNITED STATES PATENT AND TRADEMARK OFFICE
CERTIFICATE OF CORRECTION

| | | |
|---|---|---|
| PATENT NO. | : 8,729,518 B2 | Page 1 of 1 |
| APPLICATION NO. | : 13/281186 | |
| DATED | : May 20, 2014 | |
| INVENTOR(S) | : Matthew D. Pickett et al. | |

It is certified that error appears in the above-identified patent and that said Letters Patent is hereby corrected as shown below:

In the Claims

In column 11, line 63, in Claim 1, after "signal" insert -- line --.

In column 12, line 25, in Claim 6, delete "Se," and insert -- Sc, --, therefor.

Signed and Sealed this
Thirteenth Day of January, 2015

Michelle K. Lee
*Deputy Director of the United States Patent and Trademark Office*